United States Patent
Park et al.

(10) Patent No.: US 10,985,793 B1
(45) Date of Patent: Apr. 20, 2021

(54) TUNABLE RF FRONTEND

(71) Applicant: QUALCOMM Incorporated, San Diego, CA (US)

(72) Inventors: Chan Hong Park, San Jose, CA (US); Charles James Persico, Rancho Santa Fe, CA (US); Beomsup Kim, Los Altos Hills, CA (US); Yongwang Ding, Pleasanton, CA (US); Jin-Su Ko, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/595,337

(22) Filed: Oct. 7, 2019

(51) Int. Cl.
| | |
|---|---|
| *H04B 1/68* | (2006.01) |
| *H04B 1/40* | (2015.01) |
| *H04M 1/02* | (2006.01) |
| *H03F 3/213* | (2006.01) |
| *H03F 3/68* | (2006.01) |
| *H03F 1/56* | (2006.01) |

(52) U.S. Cl.
CPC ............... *H04B 1/40* (2013.01); *H03F 1/56* (2013.01); *H03F 3/213* (2013.01); *H03F 3/68* (2013.01); *H04M 1/0202* (2013.01); *H03F 2200/222* (2013.01); *H03F 2200/294* (2013.01); *H03F 2200/387* (2013.01); *H03F 2200/451* (2013.01)

(58) Field of Classification Search
CPC ... H04B 1/40; H03F 1/56; H03F 3/213; H03F 3/68; H03F 2200/222; H03F 2200/294; H03F 2200/387; H03F 2200/451; H04M 1/0202
USPC ........................................................ 455/77
See application file for complete search history.

(56) References Cited

U.S. PATENT DOCUMENTS

| | | | |
|---|---|---|---|
| 8,626,204 B1 * | 1/2014 | Oroskar | H04W 68/025 455/458 |
| 2014/0062614 A1 * | 3/2014 | Park | H03H 9/72 333/133 |
| 2016/0344352 A1 * | 11/2016 | Chang | H03F 3/45475 |
| 2017/0279479 A1 * | 9/2017 | Adams | H04B 1/0057 |
| 2020/0099390 A1 * | 3/2020 | Anderson | H03M 1/0624 |
| 2020/0099503 A1 * | 3/2020 | Khan | H04L 5/1423 |
| 2020/0112969 A1 * | 4/2020 | Dai | H04W 4/06 |
| 2020/0120458 A1 * | 4/2020 | Aldana | H04W 28/22 |
| 2020/0120734 A1 * | 4/2020 | Tsai | H04W 8/005 |
| 2020/0195280 A1 * | 6/2020 | Burra | H04B 1/0057 |

OTHER PUBLICATIONS

QORVO: "How to Implement Aperture Tuning", E-Guide, 2019, pp. 1-20.

* cited by examiner

*Primary Examiner* — Kathy W Wang-Hurst
*Assistant Examiner* — Max Mathew
(74) *Attorney, Agent, or Firm* — Haynes and Boone, LLP

(57) ABSTRACT

An advantageously fast and asynchronous interface is disclosed for the tuning of an RF frontend. The interface transmits a tuning word to the RF frontend that controls a tuning of the RF frontend responsive to a channel index.

10 Claims, 5 Drawing Sheets

TUNABLE RF FRONTEND

TECHNICAL FIELD

This application relates to radio frequency (RF) frontends, and more particularly to a tunable RF frontend.

BACKGROUND

In a cellular telephone, an RF frontend refers to the analog filters, low-noise amplifiers, and other components between the antennas and the mixers. Alternatively, the RF frontend may also include the mixers such that it includes all components between the antennas and a digital baseband section. Regardless of how the RF frontend is defined, the emergence of new high-bandwidth communication protocols such as the fifth-generation cellular network technology (5G) demands more and more flexibility from the RF frontend to cover multiple frequency bands.

To service a plurality of frequency bands, it is conventional for a multi-band system to include multiple frontend modules (FEMs) such that each FEM supports a corresponding one of the frequency bands. However, the bandwidth of each of the frequency bands is increasing to meet the gigabit data rates requirements for the 5G protocol. It is challenging for a single FEM to cover the entire corresponding frequency band as the bandwidth of the corresponding frequency band increases. In addition, the frequency response of the FEM becomes more sensitive to process variation at the higher 5G frequencies such as in the millimeter wave spectrum. A tunable FEM optimizes performance across its frequency band and also accounts for process variations. But the form factor for FEMs is typically small, which limits the number of terminal or pins for tuning control.

Accordingly, there is a need in the art for improved tunable RF frontends.

SUMMARY

In accordance with a first aspect of the disclosure, an RF system is disclosed that includes: a transceiver including a first encoder configured to map a channel index into a tuning word; and an RF frontend including at least one tunable circuit that is tuned according to the tuning word.

In accordance with a second aspect of the disclosure, an RF system is disclosed that includes: a transceiver including a first encoder configured to map a channel index into a tuning word; and an RF frontend including a plurality of power amplifiers, wherein the RF frontend is configured to select from the plurality of power amplifiers responsive to the tuning word.

In accordance with a third aspect of the disclosure, a method of tuning a tunable RF frontend is provided that includes: mapping a channel index into a tuning word; tuning the tunable RF frontend responsive to the tuning word to form a tuned RF frontend; and driving an RF signal occupying a channel identified by the channel index into the tuned RF frontend to transmit the RF signal through at least one antenna.

These and additional features may be better appreciated through the following detailed description.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

A system is provided that includes a digital baseband such as included within an RF transceiver that drives at least one tunable frontend. The RF transceiver includes the mixers for mixing from baseband to RF as well as from RF to baseband. However, in alternative embodiments, the mixers may instead be included within the tunable frontend. The RF transceiver includes an encoder for encoding a channel index into a tuning word for tuning the tunable frontend. The width of the tuning word depends upon the resolution of the tuning in the tunable frontend. The following discussion will assume that the tuning is performed by at least one tunable resonant tank circuit for matching the tunable frontend to the RF transceiver. However, other types of circuits may be used for tuning such as an adjustable autotransformer.

Since the width of the tuning word depends upon the resolution of the tunable resonant tank circuits within the tunable frontend, the tuning word will typically range from one to three bits in width such that the tunable resonant tank circuit may have up to eight different settings, but it will be appreciated that higher resolution tuning may be used in alternative embodiments. The RF transceiver transmits the tuning word in parallel to the tunable frontend. Should the tuning word be 3-bits wide, the tunable frontend would thus include a tuning word interface having three terminals or pins for receiving the tuning word. The transmission from the RF transceiver to the tunable frontend over the tuning word interface is thus advantageously asynchronous yet requires relatively few pins.

The encoding of the channel index is based upon the frequency band for the channel index. Channel indices for the lower frequency bands are mapped by the encoding to a tuning word that will tune for a relatively low frequency. Similarly, channel indices for higher frequency bands are encoded into a tuning word that will tune for a relatively higher frequency.

Figure 1:
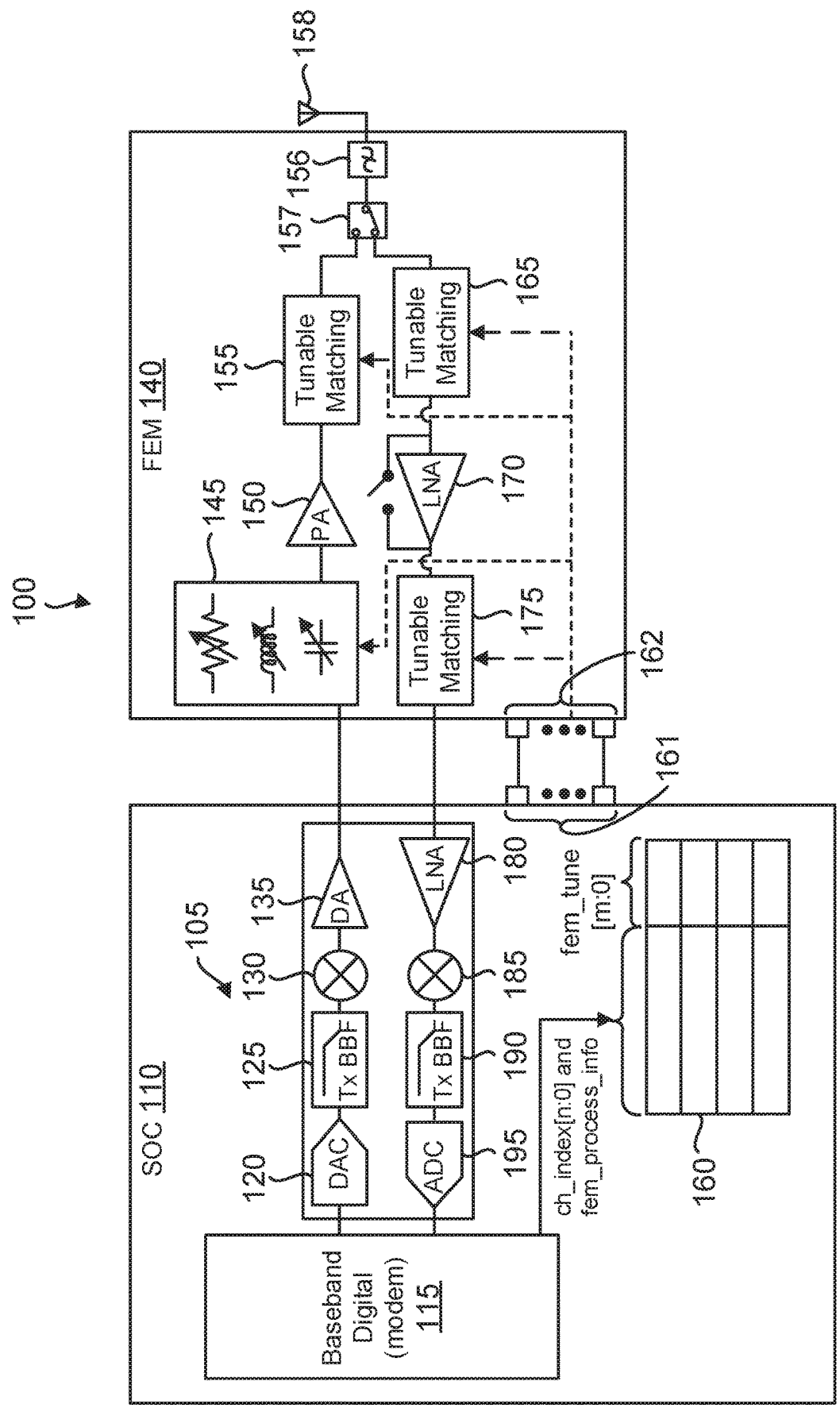
FIG. 1 is a diagram of an RF system including an SoC and an RF frontend in accordance with a first aspect of the disclosure.

An example system 100 is shown in FIG. 1. An RF transceiver 105 within an SoC 110 includes a digital baseband (modem) 115 that generates a digital baseband signal for transmission through a transmitter chain that includes a digital-to-analog converter (DAC) 120 for converting the digital baseband signal into analog form, a transmitter baseband filter (BBF) 125 for filtering the analog baseband signal, a mixer 130 for upconverting the filtered analog baseband signal into an RF signal, and a driver amplifier 135 for driving the RF signal to a tunable frontend 140. It will be appreciated that SoC 110 may just include digital baseband 115 in alternative embodiments. Tunable frontend 140 may be integrated into an RF integrated circuit (RFIC) in some embodiments.

Tunable frontend 140 includes a plurality of tunable resonant circuits including a tunable resonant circuit 145 that matches an input impedance of a power amplifier (PA) 150 to an output impedance of driver amplifier 135. More generally, tunable resonant circuit 145 matches an input impedance of power amplifier 150 to a first desired value. Tunable resonant circuit 145 includes an inductor L and a capacitor C arranged either in parallel or in serial. At least one of the inductor or the capacitor has a variable impedance responsive to the tuning word. The resulting resonant LC combination may also include a tunable resistor R. Another tunable resonant circuit 155 matches the output impedance of power amplifier 150 to an input impedance of a bandpass filter 156 when an output of tunable resonant circuit 155 is selected by a switch 157. More generally, tunable resonant circuit 155 matches the output impedance of power amplifier 150 to a second desired value. Tunable resonant circuit 155 is constructed analogously as discussed for tunable resonant circuit 145 and is tuned by the same tuning word. In alternative embodiments, the tuning of tunable resonant circuit 155 may be independent of the tuning of tunable resonant circuit 145. Switch 157 selects for the output of tunable resonant circuit 155 when RF transceiver 105 is transmitting through bandpass filter 156 to an antenna 158.

During transmission, digital baseband modem 115 knows the channel index (ch_index[n:0]), which is a digital word that is n+1 bits wide and identifies the particular channel(s) to be used for the transmission of an RF signal from RF transceiver 105. RF transceiver 105 includes a first encoder 160 that encodes the channel index into a digital tuning word (fem_tune[m:0]) that is m+1 bits wide, where m is less than n. For example, if the tuning resolution for tunable resonant circuits 145 and 155 is two bits (four different tuning states), m would equal one. In contrast, m would typically equal seven for a 5G channel index embodiment.

Encoder 160 may comprise a look-up table that maps the channel index into the tuning word. With regard to this mapping, note that there would be four tuning states in an embodiment in which the tuning word is two-bits wide. The channel index would thus be subdivided into four different channel groups. All the channel indices lying within a given channel group are mapped to the same tuning word by encoder 160. This mapping may be linear such that the width of the channel index word is divided into four channel groups each having the same bandwidth. Alternatively, the mapping may be non-linear so that the channel groups are not equal in bandwidth. Regardless of whether the mapping is linear or non-linear, the resulting transformation of the channel index into the tuning word by encoder 160 is advantageously fast. Moreover, each resulting bit of the tuning word may be assigned to its own terminal or pin for both SoC 110 and frontend 140. For example, if the tuning word is two-bits wide, there would be two terminals or pins 161 for SoC 110 to transmit the tuning word and a corresponding set of two terminals or pins 162 for tunable frontend 140 to receive the tuning word. The transmission of the tuning word is thus advantageously asynchronous to the clocking of either SoC 110 or of tunable frontend 140.

The mapping in encoder 160 from the channel index to the tuning word may also be dependent upon a process corner parameter (process, voltage, and temperature) for tunable frontend 140. For example, whether tunable frontend 140 is manufactured with a slow or fast process corner may be detected at manufacture. Encoder 160 may then adjust its mapping of the channel index into the tuning word based upon the detected process corner (fem_process_info). For example, a system memory (not illustrated) may store multiple copies of a lookup table for implementing encoder 160. Depending upon the detected process corner, the lookup table may then be instantiated with the appropriate copy from the system memory. This programming of encoder 160 may be implemented through software or though dedicated logic circuitry.

The tuning while transceiver 105 receives an RF signal is analogous to that used for transmission. During a receive mode, an RF signal couples through antenna 158, bandpass filter 156, and switch 157 to drive a tunable resonant circuit 165. Tunable resonant circuit 165 matches an output impedance of bandpass filter 156 to an input impedance of a low-noise amplifier (LNA) 170. More generally, tunable resonant circuit 165 matches the output impedance of bandpass filter 156 to a third desired value. Similarly, frontend 140 includes a tunable resonant circuit 175 that matches an output impedance of LNA 170 to an input impedance of an LNA 180 in transceiver 105. More generally, tunable resonant circuit 175 matches the output impedance of LNA 180 to a fourth desired value. The tuning of tunable resonant circuits 165 and 175 is controlled by the tuning word as received over terminals 162. Within transceiver 105, a mixer 185 mixes the received RF signal from LNA 180 down to an analog baseband signal. A baseband filter 190 filters the analog baseband signal from mixer 185 to provide a filtered analog baseband signal to an analog-to-digital converter (ADC) 195. ADC 195 converts the filtered analog baseband signal into a received digital baseband signal for baseband modem 115.

In tunable frontend 140, tunable resonant circuits 165 and 175 may be constructed as discussed for tunable resonant circuit 145 and respond to the same tuning word. Alternatively, tunable resonant circuits 145, 155, 165, and 175 may be independently tuned with respect to each other.

Figure 2:
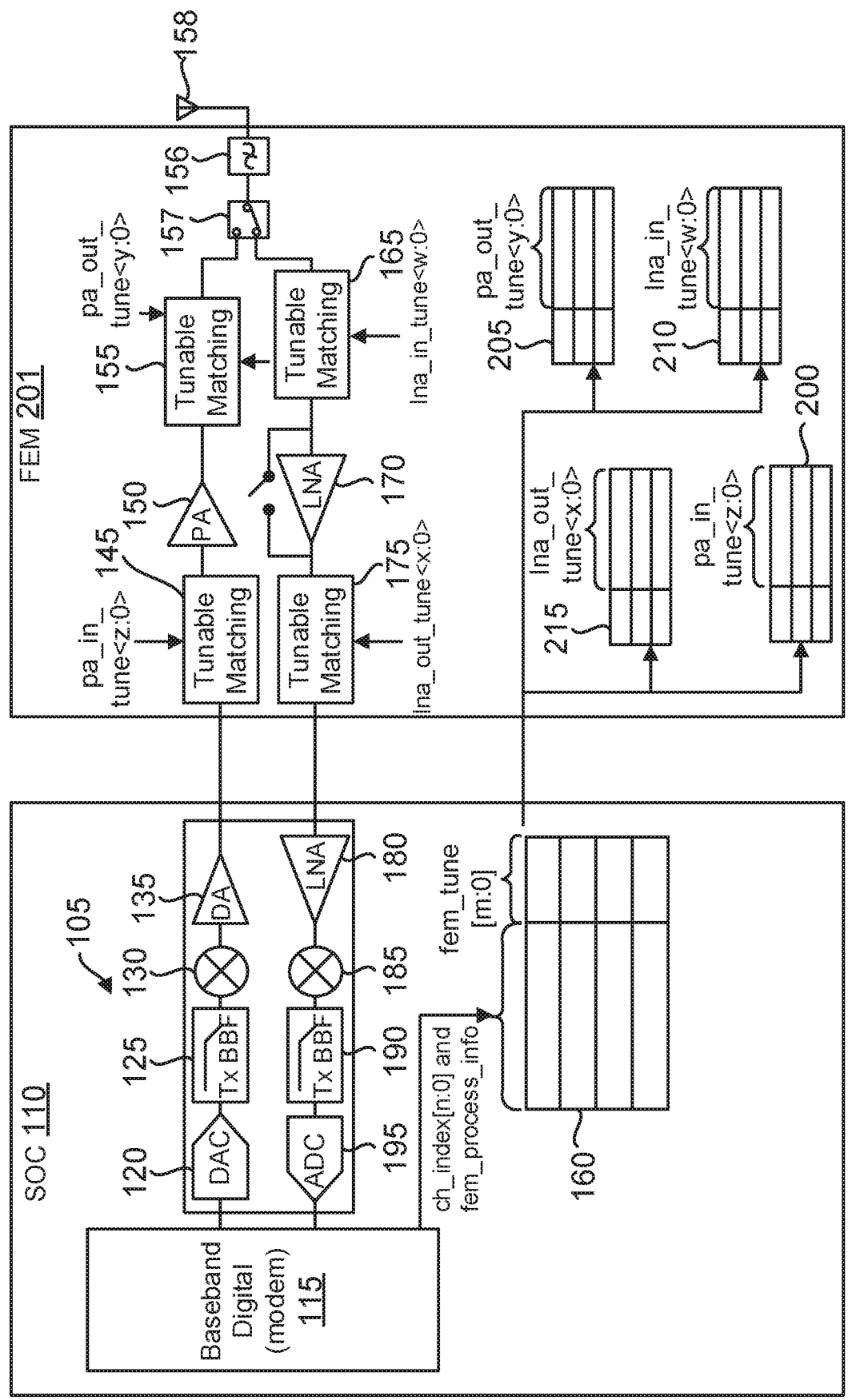
FIG. 2 is a diagram of an RF system including an SoC and an RF frontend in accordance with a second aspect of the disclosure.

To provide additional independence to the tuning of the various tunable resonant circuits in tunable frontend 140, the tuning word from first encoder 160 may function as an index into second encoders (e.g., look-up tables) as shown in FIG. 2 for a tunable frontend 201. SoC 110 is arranged as discussed for system 100. Similarly, tunable frontend 201 is arranged as discussed for tunable frontend 140 but for the addition of second encoders 200, 205, 210, and 215. Within tunable frontend 201, each tunable resonant circuit receives a tuning word from its own corresponding second encoder. For example, second encoder 200 maps the tuning word from encoder 160 into a power amplifier input tuning word (pa_in_tune<z:0>) for tunable resonant circuit 145. Similarly, second encoder 205 maps the tuning word from encoder 160 into a power amplifier output tuning word (pa_out_tune<y:0>) that tunes tunable resonant circuit 155. In addition, second encoder 210 maps the tuning word from encoder 160 into an LNA input tuning word (lna_in_tune<w:0>) that tunes tunable resonant circuit 165. Finally, second encoder 215 maps the tuning word from encoder 160 into an LNA output tuning word (lna_out_tune<x:0>) that tunes tunable resonant circuit 175. The integers x, w, y, and z may all independent of each other. Alternatively, tunable frontend 201 may include a single second encoder that maps the tuning word from encoder 160 into a single tuning word that is shared by the various tunable resonant circuits. Terminals 161 and 162 are not shown in FIG. 2 for illustration clarity.

Figure 3:
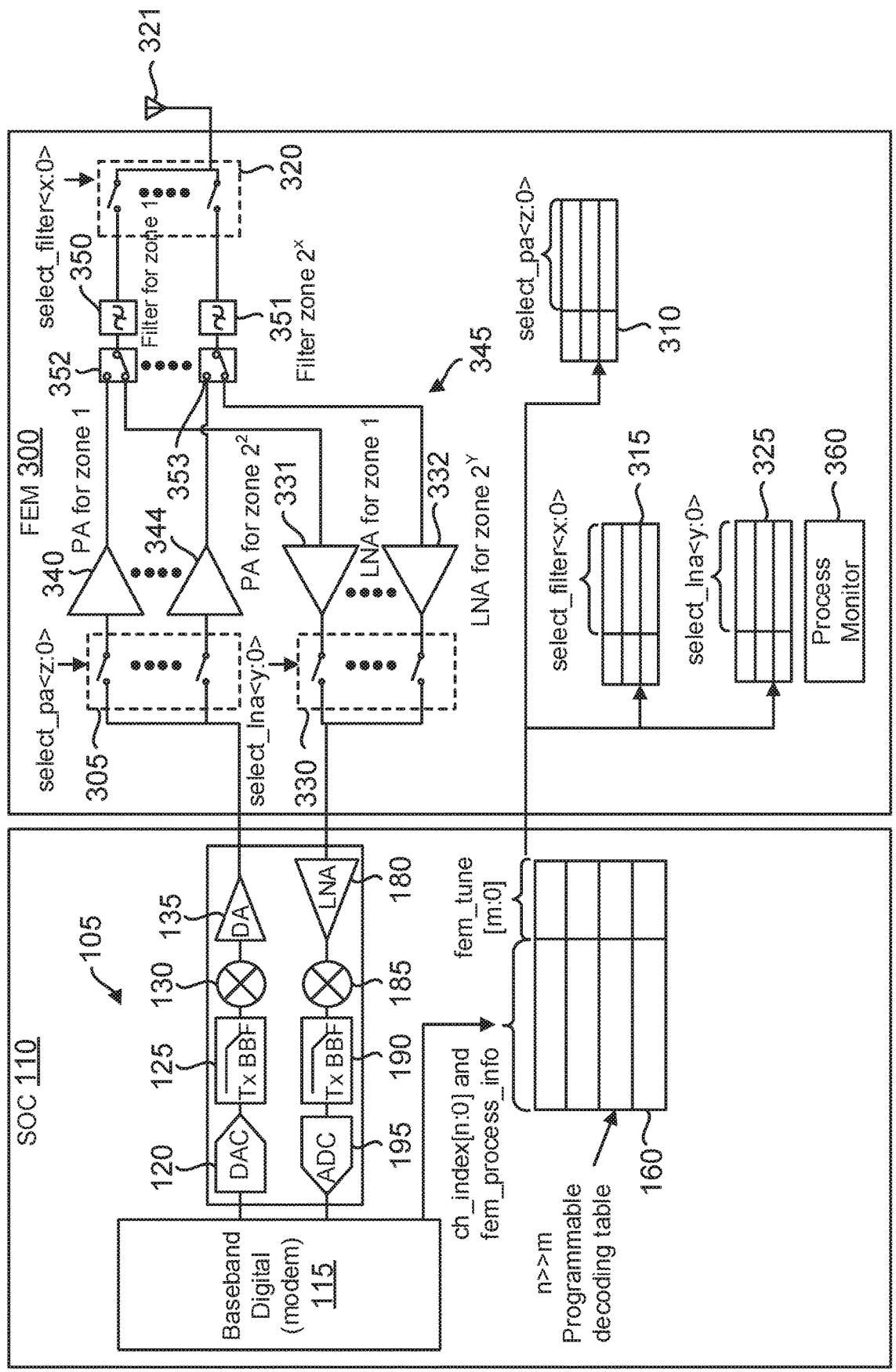
FIG. 3 is a diagram of an RF system including an SoC and an RF frontend in accordance with a third aspect of the disclosure.

The tuning of the RF frontend may be extended into the selection of hardware for a selected frequency band as shown in FIG. 3 for a tunable frontend 300. SoC 110 is arranged as discussed for system 100. Tunable frontend 300 includes one or more second encoders for further encoding the tuning word. These second encoders control the tuning of tunable frontend 300 for a particular frequency zone or bandwidth for both transmission and reception. For example, tunable frontend 300 may include a plurality of power amplifiers selected for by a switch matrix 305. A second encoder 310 encodes the digital tuning word into a power amplifier selection word (pa<z:0>) that controls the selection of a particular power amplifier by switch matrix 305. Each power amplifier maps to a different frequency band or zone of operation for frontend 300. There are $2^z$ power amplifiers that may be selected from depending upon the frequency band, where z is a positive integer. For example, while transmitting in a frequency zone 1, switch matrix 305 selects for a zone 1 power amplifier 340 so driver amplifier 135 may drive power amplifier 340. While transmitting in a frequency zone $2^z$, switch matrix 305 selects for a zone $2^z$ power amplifier 344. As the frequency zone varies from zone 1 to zone $2^z$, additional power amplifiers (not illustrated) would be selected by switch matrix 305 as controlled by the power amplifier selection word from second encoder 310.

Tunable frontend 300 also includes an encoder 315 for encoding the tuning word into a filter selection word (select_filter<x:0>) that controls a switch matrix 320 for a plurality of bandpass filters. There are $2^x$ filters that may be selected for by switch matrix 320, where x is positive integer that may be the same as or different from integer z. The selection of a particular bandpass filter depends upon the frequency zone of operation. For example, for transmission in a filter zone 1, switch matrix 320 selects for a bandpass filter 350 so that a power amplifier may drive an antenna 321 with a filtered RF signal. For transmission in a filter zone $2^x$, switch matrix 320 selects for a bandpass filter 351 so that the corresponding one of the power amplifiers may drive antenna 321 with the filtered RF signal. As the selected filter varies from filter zone 1 to filter zone $2^x$, additional filters (not illustrated) would be selected for by switch matrix 320 as controlled by the filter selection word.

The selection of filters including filter 350 and filter 351 may also occur during a receive mode as controlled by a corresponding set of switches. For example, a switch 352 controls whether bandpass filter 350 is selected for transmission or reception. Similarly, a switch 353 controls whether bandpass filter 351 is selected for transmission or reception. Depending upon the frequency zone used during reception, a switch matrix 330 selects from a plurality of LNAs. To select from the LNAs, a second encoder 325 encodes the tuning word into an LNA selection word (select_lna<y:0>) that controls the selection of the LNAs through a switch matrix 330. There are $2^y$ LNAs to select from depending upon the frequency zone. For example, for reception in frequency zone 1, switch matrix 330 selects for an LNA 331 as controlled by the LNA selection word. For reception in a frequency zone 2y, switch matrix 330 selects for an LNA 332. Since there is an LNA 180 in SOC 110 in the receive chain, note that the LNAs in tunable frontend 300 may be bypassed in alternative embodiments. Referring again to FIGS. 1 and 2, LNA 170 may also be bypassed in alternative embodiments.

In some embodiments, tunable frontend 300 may include a single second encoder (not illustrated) that controls the selection of the power amplifiers, the bandpass filters, and the LNAs. Such a single second encoder would replace second encoders 315, 310, and 325. A process monitor 360 in tunable frontend 300 may be included that detects the process corner for tunable frontend 300 so that the encoding by second encoders 315, 310, and 325 may be adjusted responsive to the detected process corner.

Figure 4:
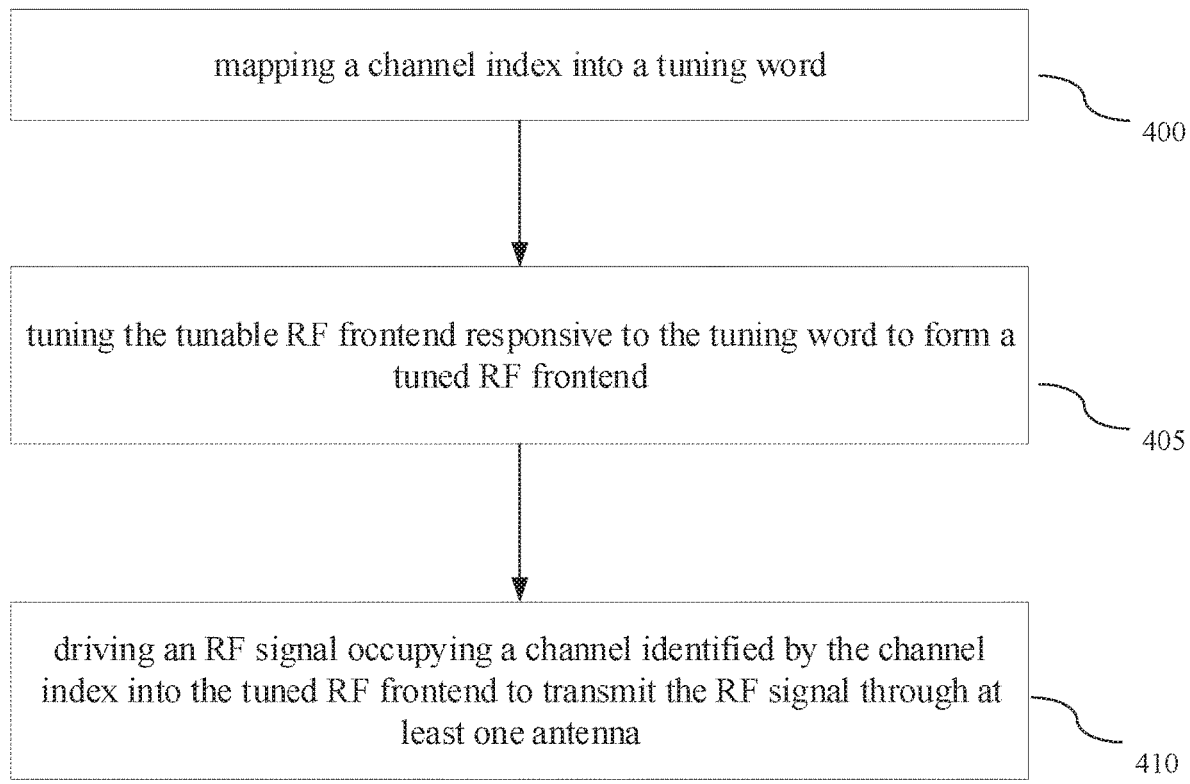
FIG. 4 is a flowchart for an example method of tuning an RF frontend in accordance with an aspect of the disclosure.

A method of tuning a tunable RF frontend will now be discussed with regard to the flowchart shown in FIG. 4. The method includes an act 400 of mapping a channel index into a tuning word. The mapping by first encoder 160 (or by first encoder 160 in combination with one or more second encoders) is an example of act 400. The method also includes an act 405 of tuning the tunable RF frontend responsive to the tuning word to form a tuned RF frontend. The tuning of any of tunable frontends 140, 201, or 300 is an example of act 405. Finally, the method includes an act 410 of driving an RF signal occupying a channel identified by the channel index into the tuned RF frontend to transmit the RF signal through at least one antenna. The action of the transmit chain in SoC 110 to drive the RF signal through tunable frontends 140 or 201 to transmit over antenna 158 or to drive the RF signal into tunable frontend 300 to transmit over antenna 321 is an example of act 410.

Figure 5:
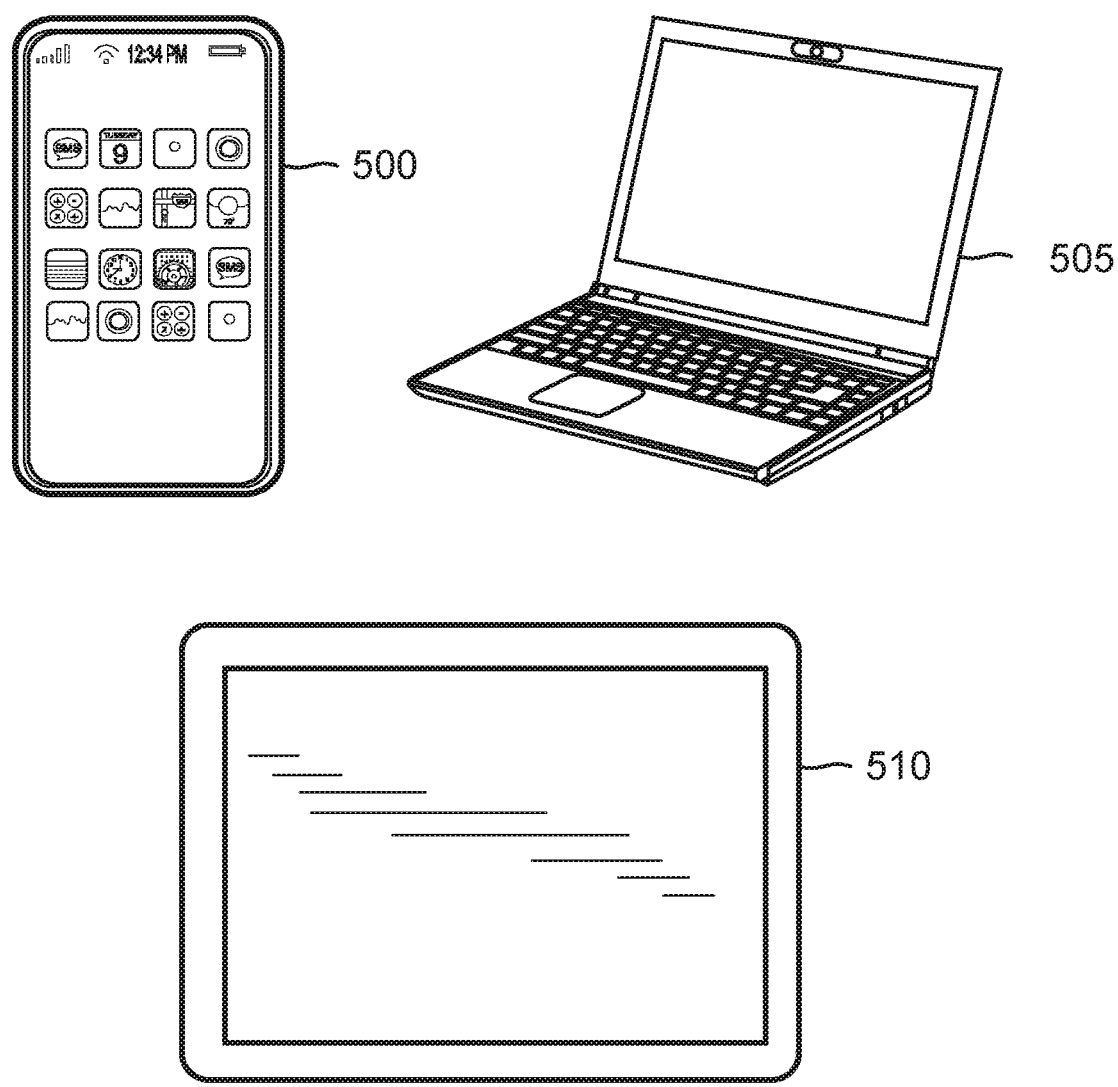
FIG. 5 illustrates some example electronic systems including a tunable RF frontend in accordance with an aspect of the disclosure.

A tunable frontend as disclosed herein may be incorporated into a wide variety of electronic systems. For example, as shown in FIG. 5, a cellular telephone 500, a laptop computer 505, and a tablet PC 510 may all include a tunable frontend in accordance with the disclosure. Other exemplary electronic systems such as a music player, a video player, a communication device, and a personal computer may also be configured with tunable frontends constructed in accordance with the disclosure.

Those of some skill in this art will by now appreciate and depending on the particular application at hand, many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. An RF system, comprising:
   a transceiver integrated circuit including a first encoder configured to map a channel index having a plurality of N bits into a tuning word having a plurality of M bits, M and N both being positive integers and M being less than N; and
   an RF frontend integrated circuit including:
   a plurality of M terminals for receiving the tuning word:
   a power amplifier configured to amplify an RF signal from the transceiver integrated circuit; and
   a first tunable circuit that is tuned responsive to the tuning word to match an input impedance of the power amplifier to a first value.

2. The RF system of claim 1, wherein the RF frontend integrated circuit further includes a second encoder for mapping the tuning word into an additional tuning word, wherein the first tunable circuit is tuned according to the additional tuning word.

3. The RF system of claim 1, wherein the RF frontend integrated circuit further includes a second tunable circuit configured to match an output impedance of the power amplifier to a second value responsive to the tuning word.

4. The RF system of claim 3, herein the RF frontend integrated circuit further comprises:
   a low-noise amplifier (LNA); and a third tunable circuit configured to match an input impedance of the LNA to a third value responsive to the tuning word.

5. The RF system of claim 4, wherein the RF frontend integrated circuit further includes a fourth tunable circuit configured to match an output impedance of the LNA to a fourth value responsive to the tuning word.

6. The RF system of claim 1, wherein the first encoder is further configured to map the channel index into the tuning word responsive to a process corner parameter for the RF frontend integrated circuit.

7. A method of tuning a tunable RF frontend, comprising:
in a transceiver integrated circuit mapping a channel index having a plurality of N bits into a tuning word having a plurality of M bits, M and N both being positive integers and M being less than N;
receiving the tuning word over M terminals at an RF frontend integrated circuit;
tuning a first tuning circuit responsive to the tuning word to adjust an input impedance of a power amplifier in the RF frontend integrated circuit to a first value to form a tuned RF frontend integrated circuit;
and
driving an RF signal occupying a channel identified by the channel index into the tuned RF frontend integrated circuit to transmit the RF signal through at least one antenna.

8. The method of claim 7, wherein mapping the channel index into the tuning word is also responsive to a process corner parameter for the tuned RF frontend integrated circuit.

9. The method of claim 7, further comprising:
tuning a second tunable circuit responsive to the tuning word to match an output impedance of the power amplifier in the tuned RF frontend integrated circuit to a second desired value.

10. The method of claim 9, further comprising setting a switch to couple an output of the power amplifier through a bandpass filter to the at least one antenna.

* * * * *